United States Patent
Singh et al.

(10) Patent No.: US 6,752,899 B1
(45) Date of Patent: Jun. 22, 2004

(54) ACOUSTIC MICROBALANCE FOR IN-SITU DEPOSITION PROCESS MONITORING AND CONTROL

(75) Inventors: Bhanwar Singh, Morgan Hill, CA (US); Arvind Halliyal, Sunnyvale, CA (US); Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 138 days.

(21) Appl. No.: 10/050,499

(22) Filed: Jan. 16, 2002

(51) Int. Cl.[7] .............................................. H01L 21/00
(52) U.S. Cl. ..................... 156/345.24; 438/14
(58) Field of Search ......................... 156/345; 216/84; 438/14; 118/704, 715, 697–698

(56) References Cited

U.S. PATENT DOCUMENTS 5,076,094 A    12/1991    Frye et al.
5,885,402 A *   3/1999    Esquibel ................ 156/345.24

* cited by examiner

*Primary Examiner*—David Nelms
*Assistant Examiner*—David Vu
(74) *Attorney, Agent, or Firm*—Eschweiler & Associates, LLC

(57) ABSTRACT

The invention provides a system and process for depositing films, wherein an acoustic microbalance is used for process monitoring and/or control. The acoustic microbalance is placed in a deposition chamber and may optionally be mounted on a semiconductor substrate, such as a silicon wafer, on which a film is being deposited. Data from the acoustic microbalance is employed to detect a process endpoint, determine an adjustment to process conditions for a subsequent batch, and/or provide feedback control over current process conditions. One aspect of the invention involves the application of a model or database to correct for differences between the extent of deposition on an acoustic microbalance cantilever and the extent of deposition on a substrate being processed. Another aspect of the invention takes a probabilistic approach to employing acoustic microbalance data. The acoustic microbalance data is employed, optionally together with other process data, as evidence in a probabilistic dependancy model that infers the process state and/or predicts a process outcome.

19 Claims, 4 Drawing Sheets

US 6,752,899 B1

ACOUSTIC MICROBALANCE FOR IN-SITU DEPOSITION PROCESS MONITORING AND CONTROL

TECHNICAL FIELD OF THE INVENTION

The present invention relates generally to semiconductor device manufacturing and more particularly to a system and a method for depositing films.

BACKGROUND OF THE INVENTION

In the semiconductor industry, there is a continuing trend toward high device densities. To achieve these high device densities, small structures on semiconductor wafers are required. These small structures create high demands for precision in semiconductor processing.

One answer to these demands is to improve in situ process monitoring. In situ process monitoring allows the progression of process steps to be monitored for the purposes of detecting process endpoints and/or controlling process variables such as input power, gas pressure, temperature, and flow, whereby the consistency of process outcomes can be improved. In situ process monitoring, however, can be costly, can be a source of process failure and downtime, and can result in wafer contamination.

An example of a process where there is a need for in situ process monitoring and control is metal film deposition. Metal film deposition is an important step in semiconductor device manufacturing. Deposited metal films are used to form interconnect lines, bus structures, Schottky barriers, ohmic contacts or other structures. Deposition of an appropriate thickness of metal film is often important. For example, if too thin a metal film is deposited, an interconnect line formed from that film may be unacceptably resistive or may have a greater likelihood of becoming an open circuit either during subsequent processing steps or during the normal operation of the device. If too thick a metal film is deposited, deposition time is unduly extended and the film thickness may be in excess of the tolerances of later processing steps. The process endpoint, where the metal film has reached the desired thickness, varies from run to run due to uncontrolled variations of process variables.

A quartz crystal microbalance has been experimentally tested to detect the end point in a metal film deposition process. The microbalance is placed adjacent the semiconductor substrate on which the metal film is being deposited. Based on the variation in the resonant frequency of the quartz crystal with weight of film that deposits on the quartz, the thickness of the deposited film is estimated. When the thickness reaches the target thickness for the wafer, the process is terminated. Unfortunately, the deposition rate on the quartz crystal microbalance can differ from that on the adjacent substrate. In addition, it has been recognized that the reliability of the quartz crystal microbalance measurements varies from run to run. Thus, the quartz crystal microbalance has not been used extensively for deposition process endpoint detection. In general, there remains an unsatisfied need for effective systems and methods for in situ process monitoring and control in semiconductor device manufacturing.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

The present invention provides a system and process for depositing films, wherein an acoustic microbalance is used for process monitoring and/or control. The acoustic microbalance is placed in a deposition chamber and may optionally be mounted on a semiconductor substrate, such as a silicon wafer, on which a film is being deposited. Data from the acoustic microbalance is employed to detect a process endpoint, determine an adjustment to processing conditions for a subsequent batch, and/or provide feedback control over current processing conditions.

One aspect of the invention involves the application of a model or database to correct for differences between the extent of deposition on an acoustic microbalance cantilever and the extent of deposition on a substrate being processed. The model can account for systematic differences and also the dependancy of those differences on factors such as temperature and initial thickness of coating on the microbalance cantilever.

Another aspect of the invention takes a probabilistic approach to employing acoustic microbalance data. The acoustic microbalance data is viewed as evidence of the state of a deposition process (principally the extent of deposition), without necessarily interpreting the acoustic microbalance data to determine the amount of film deposited on the microbalance cantilever. Rather, the microbalance data is employed, optionally together with other process data, as evidence in a probabilistic dependancy model that infers the process state and/or predicts a process outcome. Where the probabilistic dependancy model predicts a process outcome, the model can take into consideration prospective changes in process conditions. The process can then be controlled by selecting the changes predicted to result in the best process An outcome. The model can be trained with data gathered using small perturbations around a base set of processing conditions.

Other advantages and novel features of the invention will become apparent from the following detailed description of the invention and the accompanying drawings. The detailed description and drawings provide exemplary embodiments of the invention. These exemplary embodiments are indicative of but a few of the various ways in which the principles of the invention can be employed.

DETAILED DESCRIPTION OF THE INVENTION

Figure 1:
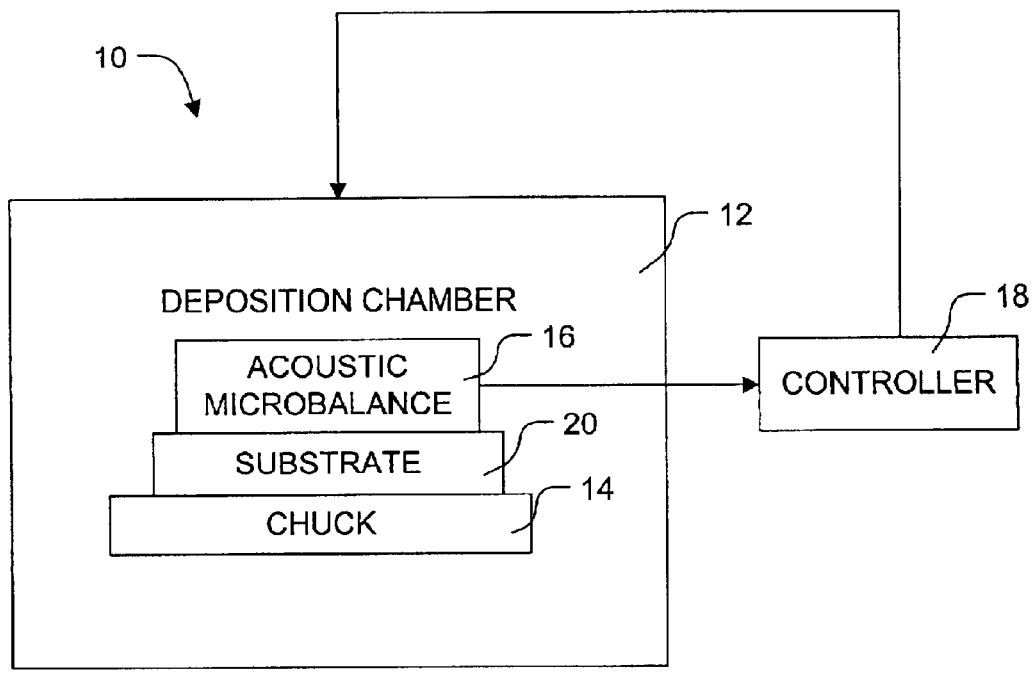
FIG. 1 is a schematic block diagram illustrating an exemplary deposition system according to one aspect of the present invention.

The present invention will now be described with reference to the drawings. FIG. 1 is a high level schematic of a deposition system 10 according to one aspect of the present invention. The deposition system 10 includes a deposition chamber 12, a chuck 14, an acoustic microbalance 16, and a controller 18. A substrate 20 is also illustrated, although the substrate 20 is not part of the deposition system 10, but rather part of the environment in which the deposition system 10 can be used. The substrate 20 is mounted for processing in the deposition chamber 12 on the chuck 14. The acoustic microbalance 16 is also mounted in the chamber 12, at least while deposition is taking place. The microbalance 16 can be mounted on the substrate 20, on the chuck 14, or elsewhere in the deposition chamber 12. The controller 18 receives data from the acoustic microbalance 16.

The deposition system 10 is employed in a process for depositing a coating on the substrate 20. Based at least in part on the data from the acoustic microbalance 16, the controller 18 does one or more of determining when the deposition process is complete, providing feedback control over the deposition process (modifying conditions for the current batch), or providing feedback control over a series of deposition processes (modifying process conditions for a subsequent batch). The system thereby employs the microbalance data to improve deposition process outcomes.

The deposition chamber 12 can be any of the apparatus commonly used to carry out deposition processes. Generally, the deposition chamber 12 will include a pressure control system, a temperature control system, and systems for controlling the flow rates of various gases. In some cases, the deposition chamber 12 will have a mechanism for generating energetic ions or molecules. The deposition chamber 12 can be configured for batch or continuous operation, although batch operation is more common. Deposition process variables associated with the deposition chamber 12 generally include, at a minimum, pressure, temperature, and a set of gas flow rates. ID one embodiment of the invention, the deposition chamber 12 is specifically adapted for processing semiconductor wafers.

The acoustic microbalance 16 can be any device including a piezoelectric material which can be used in measuring a change in the frequency or propagation speed of an acoustic wave with weight or thickness of a depositing film. In many cases, the frequency or propagation speed is determined at resonance. Examples of acoustic microbalances include a surface-acoustic-wave (SAW) device, a thickness-shear-mode (TSM) device (also termed a quartz crystal microbalance or QCM), a flexural-plate-wave (IFPW) device, and a acoustic-plate-mode (APM) device.

Figure 2:
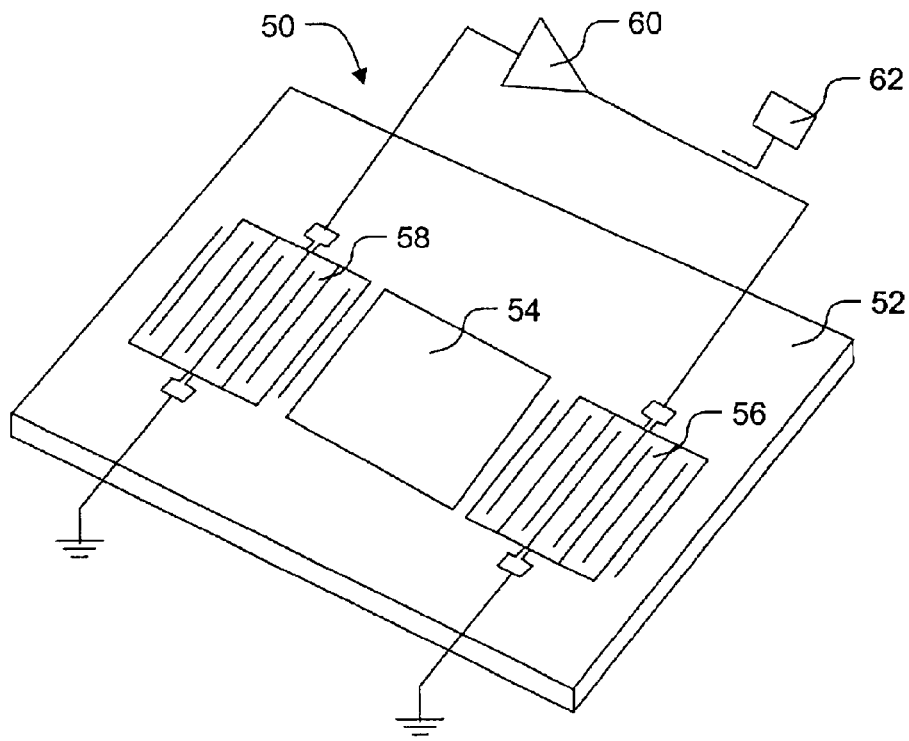
FIG. 2 is an illustration of a SAW device.

FIG. 2 illustrates an exemplary SAW device 50 that can be employed in the present invention. The SAW device 50 includes a substrate 52, a cantilever 54, interdigital electrodes (transducers) 56 and 58, an amplifier 60, and a frequency detector 62. Acoustic waves are produced by the transducer 56 and propagate to the transducer 58, which produces an electrical signal. The electrical signal is amplified by the amplifier 60 and transmitted to the transducer 56, thus producing a closed loop system that has a resonant frequency, which is detected by the frequency detector 62. The resonant frequency is highly sensitive to the amount of material deposited on the cantilever 54, which lies between the transducers 56 and 58.

The SAW device 50 can be quite small, occupying as little as 2 $mm^2$ for example. The substrate 52 can be a piezoelectric material such as crystalline quartz, lithium niobate, barium titanate, lithium tantalate or the like. Alternatively, the substrate may comprise a piezoelectric coating, such as ZnO or AlN, applied to a non-piezoelectric material, such as silicon. SAW devices have the advantage of offering a high degree of precision The acoustic microbalance 16 can also be a quartz crystal microbalance. (QCM). A QCM includes a quartz crystal, for example an AT-cut crystal, with electrodes on two opposing faces. An alternating voltage is applied to the electrodes, inducing a thickness-shear mode acoustic wave. The frequency of the wave or its speed is detected and is dependant on the thickness of a film depositing on one or both of the opposing faces. In general, QCM devices are less precise than SAW devices, but have the advantage of showing less sensitivity to temperature changes.

It is generally advantageous to locate the acoustic microbalance 16 within the deposition chamber 12 at a location where the acoustic microbalance 16 experiences processing conditions that are similar to those experienced by the substrate 20 on which a film is being deposited. For example, the acoustic microbalance 16 can be placed on the substrate 20, which can be a semiconductor wafer. A semiconductor wafer can be a production wafer or a control wafer included with a batch of production wafers. Where the acoustic microbalance 16 is located on a production wafer, the acoustic microbalance 16 is generally located on a portion of the wafer that is not intended to become a functional part of a device being manufactured. For example, the acoustic microbalance 16 can be located in an unused portion of the wafer near its perimeter. A SAW device can be placed on a wafer by applying a piezoelectric coating and forming interdigital electrodes thereon. The acoustic microbalance 16 can also be placed on the chuck 14 or elsewhere in the deposition chamber 12.

Data from acoustic microbalance 16 is supplied to and interpreted by the controller 18. In interpreting the data, it should be noted that the deposition rate on the cantilever of the acoustic microbalance 16 can differ from that on the substrate 20 for a number of reasons. First of all, the deposition conditions experienced by the acoustic microbalance 16 may differ from those experienced by the substrate 20, particularly if the microbalance is not located on the substrate 20. Second, deposition rates can be affected by the surface on which deposition is taking place. For example, depending on the deposition process, the deposition rate may vary among surfaces that are respectively silicon, quartz, and ZnO. Even after the surfaces are covered by layers of deposited material, the morphology of the coating and its surface may continue to vary due to the underlying surface. For example, the coating may have a structure reflected in the number or active sites per unit surface area that is dependent on the nature of the underlying surface. The present invention provides methods for effectively utilizing acoustic microbalances even when variations due to one or more of the foregoing causes are present.

In one embodiment, the controller 18 interprets the data in a conventional manner to calculate the thickness of the coating that has been deposited on a cantilever of the acoustic microbalance 16. A conventional interpretation involves the application of a formula that relates a wave propagation speed, a frequency, and/or a change in one of the forgoing to the extent of deposition on the cantilever. For example, the following formula relates the thickness, x, of a deposited coating to the change in resonant frequency of a SAW device:

$$x = -c\Delta f / f_0^2$$

where c is a constant, $f_0$ is the initial frequency, and $\Delta f$ is the change in frequency. One or more constants in such a formula is generally determined by calibration. The thickness of the film deposited on the substrate 20 can be assumed to be the same as the thickness of film deposited on the cantilever of the acoustic microbalance 16.

In another embodiment, the controller 18 uses a model or a database look-up to take into account a difference between the extent of deposition on the microbalance cantilever and the extent of deposition on the substrate 20. The input of a model can include, for example, temperature and/or the thickness of coating on the cantilever at the start of the deposition process. The output of a model can be, for example, a correction factor to be used in calculating the extent of deposition on the substrate 20. A database is similar to a model but contains lists of corresponding values in place of a general formula.

In a further embodiment, the controller 18 employs a probabilistic dependancy model to relate evidence, including evidence relating to the extent of deposition on the acoustic microbalance 16, to the extent of deposition on the substrate 20. The extent of deposition on the substrate 20 can be a thickness of the deposited coating, but can alternatively relate to another characteristic of the coating, such as its resistivity or its capacitance. Examples of probabilistic dependency models include decision graphs, support vector machines, Bayesian belief networks, and neural networks.

As a specific example, a decision tree can be employed having as inputs the temperature in the deposition chamber 12 and an estimate of the initial thickness of the coating on the microbalance cantilever. This initial thickness will vary if the same cantilever is used through a series of depositions. From these inputs, the model can calculate, for example, a correction factor that when multiplied by the thickness of coating deposited on the cantilever, as calculated by a conventional method, gives the thickness of coating deposited on the substrate 20. The model is trained with historical data in which thickness of coating on the substrate 20 is actually measured, after deposition is complete, whereby a correction factor for each training example can be calculated. The nodes of the decision tree branch according to a comparison between either the temperature or the initial thickness and a critical value. The critical value and variable for each node are selected by a greedy algorithm that reduces the variance of the correction factor data with the addition of each new node. The variances are with respect to the mean correction factor for all examples sorted down a branch. The values to be associated with each leaf node are obtained by averaging among the training examples sorted to that leaf node.

Figure 3:
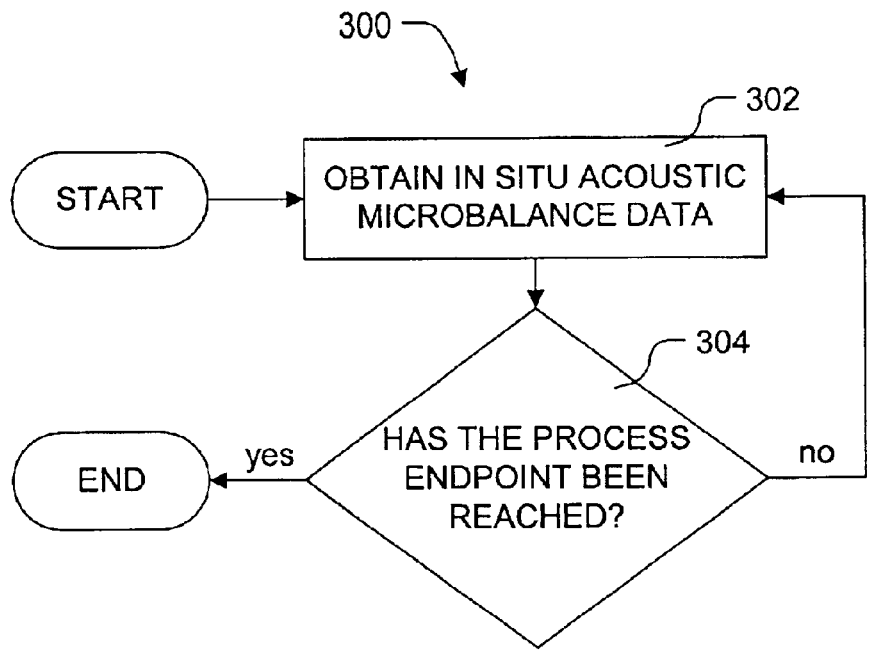
FIG. 3 is a flow diagram of a deposition process using an acoustic microbalance for endpoint detection.

FIG. 3 provides a flow diagram of a deposition process 300 using an acoustic microbalance for endpoint detection The deposition process is terminated when a desired outcome is reached as determined from acoustic microbalance data. The desired outcome is generally the deposition of a particular coating thickness on the substrate 20, but can alternatively relate to another characteristic of the coating on the substrate 20, such as a resistivity or capacitance. Act 302 is obtaining microbalance data, which is done continuously or periodically. Act 304 is analyzing the microbalance data, optionally together with other data, to determine whether the process endpoint has been reached. The analysis can be carried out according to one or more of the methods of the invention in which the thickness or other property of the coating on the substrate 20 is determined using a model or database that takes into account a difference between the extent of deposition on the microbalance cantilever and the extent of deposition on the substrate 20.

Figure 4:
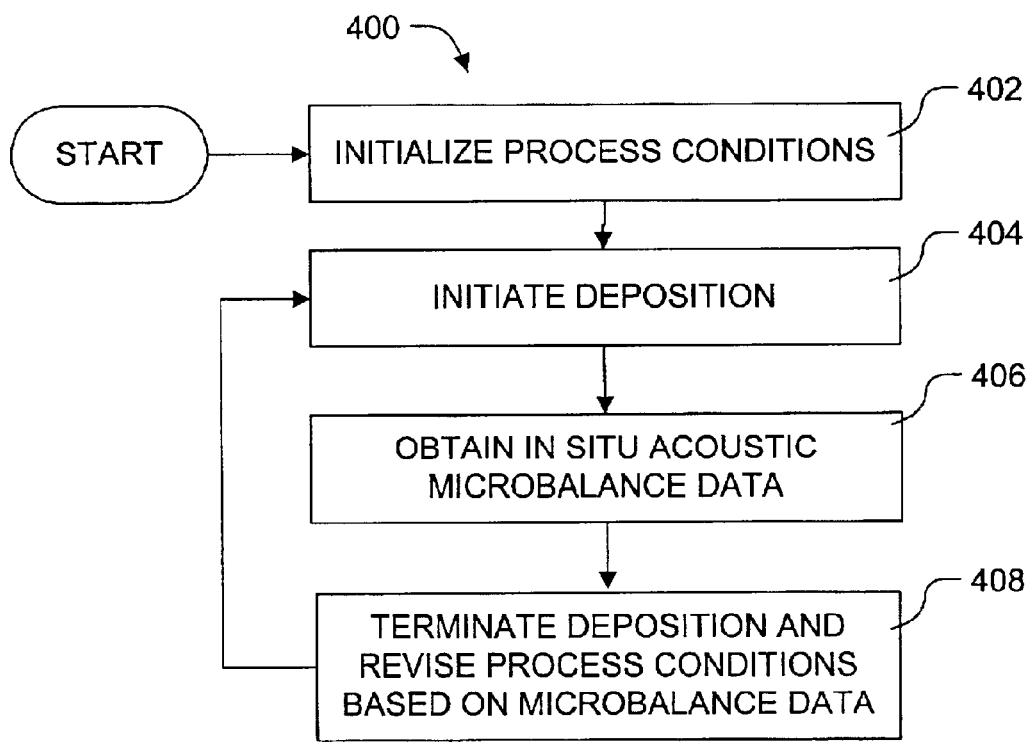
FIG. 4 is a flow diagram of a series of deposition processes using an acoustic microbalance for feedback control according to another aspect of the present invention.

FIG. 4 provides a flow diagram of a process 400 according to another aspect of the invention. According to this aspect, the controller 18 implements feedback control over a series of deposition processes. Process 400 begins with act 402, which is selecting an initial set of deposition process conditions. Act 404 is initiating a deposition process. The process 400 continues at act 406 which comprises obtaining in situ microbalance data for the current deposition process. At act 408 the deposition process terminates and a determination of revised process conditions is made for the next deposition process based on evidence that includes at least data from the acoustic microbalance 16. In act 408, a deposition rate or deposition amount for the just completed deposition process is determined and comprise the variables targeted by the control. Thus, one or more process conditions are revised to obtain the desired rate or deposition amount in a subsequent process run. The conditions can be revised according to a conventional control algorithm. Conventional control algorithms include, for example, proportional control, proportional-integral control, proportional-derivative control, proportional-integral-derivative control cascade control ratio control, override control, split-range control, time-cycle control, and program control.

Deposition rates may vary over a series of process runs for a variety of reasons, including, for example, variations in ambient conditions, reagents, substrates, and/or deposition chamber loading. Where these conditions vary gradually, or persist over a series of process runs, process 400 can compensate to improve the consistency of the deposited coatings and avoid unduly long processing that can raise costs and interfere with the flow of substrates through an overall process that includes deposition as a step.

Figure 5:
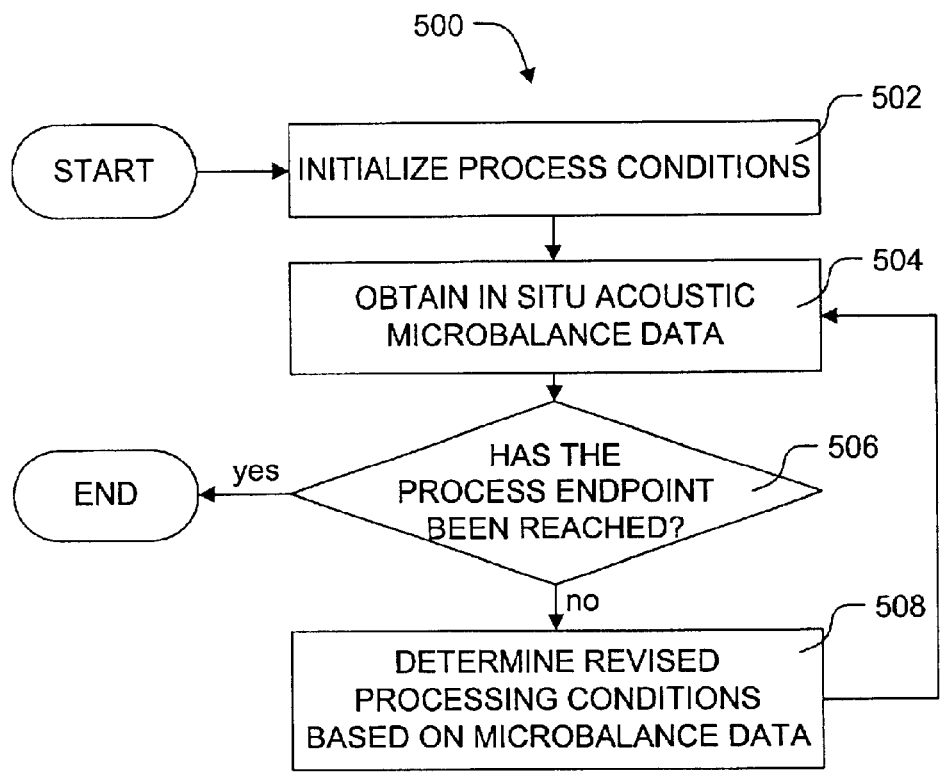
FIG. 5 is a flow diagram of a deposition process using an acoustic microbalance for feedback control according to a further aspect of the present invention.

FIG. 5 provides a flow diagram of a process 500 according to a further aspect of the invention. According to this aspect, the controller 18 implements feedback control over the current deposition processes. Act 502 comprises setting initial conditions for the deposition process while in act 504 microbalance data is obtained. The process 500 continues with act 506 wherein a determination is made whether the process endpoint has been reached. Subsequently, in act 508 a revised process condition determination is based, at least in part, on data from the acoustic microbalance 16. Thus one or more process conditions are selectively revised over the course of a deposition process in response thereto to achieve a more consistent deposition process outcome.

The control algorithm in the deposition process 500 can target the deposition rate on the substrate 20. A deposition rate can be calculated, for example, by determining the current extent of deposition on the substrate 20, subtracting the extent of deposition determined for a previous time, and dividing by the elapsed time since the previous measurement. A control algorithm, a conventional control algorithm for example, is then applied to selectively adjust one or more process variables that affects deposition rate in order to target a desired deposition rate.

Figure 6:
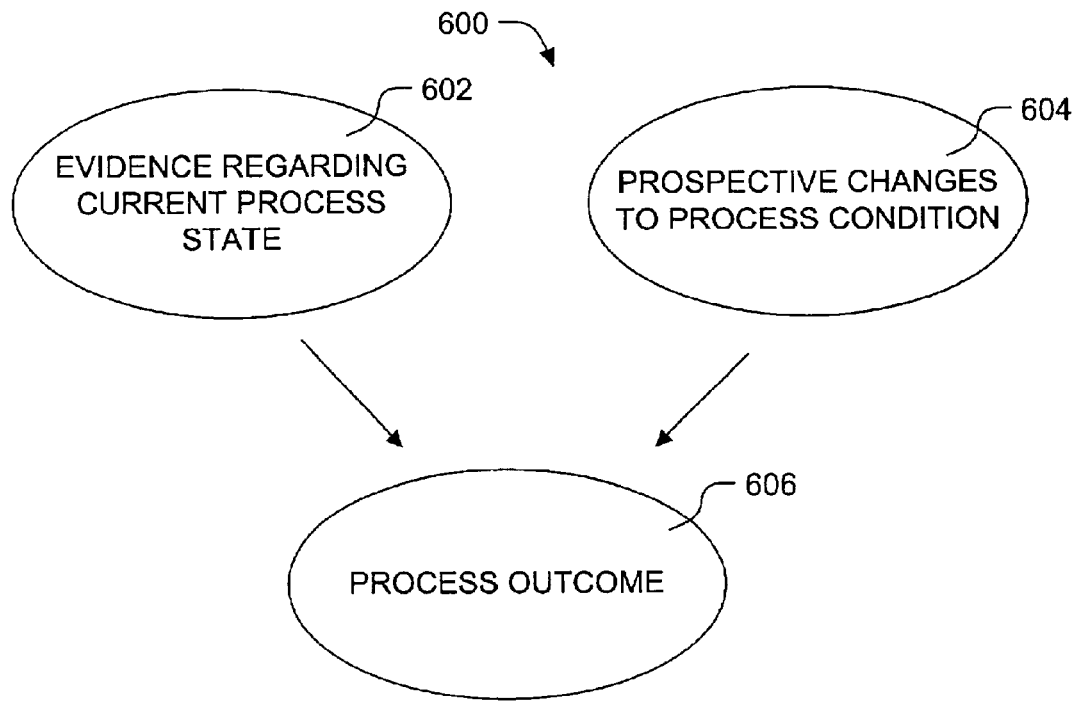
FIG. 6 is an Bayesian network diagram of the relationships encoded by a probabilistic dependancy model according to a still further aspect of the present invention.

Rather than target a deposition rate, the deposition process 500 can target an outcome for the deposition process. For example, the control algorithm can be based on a probabilistic dependancy model that relates evidence regarding the current process state and prospective changes in one or more process conditions to a process outcome. These relationships are illustrated, for example, with a Bayesian belief network 600 in FIG. 6. The Bayesian belief network 600 illustrates a process outcome 606 as being dependant on evidence 602 regarding the current process state and prospective changes 604. The evidence 602 includes at least one measurement from the acoustic microbalance 16. The evidence 602 can also include, for example, temperature, pressure, flow rates, and/or deposition rate. Generally the evidence 602 is determined as of a fixed time in the deposition process, for example, at a time that is approximately 50% of the way through the deposition process. The prospective changes 604 include, for example, adjustments to pressure, flow rates, and/or other process conditions. Generally, the prospective changes 604 are discrete changes, such as a pressure increase of 15 torr, a pressure decrease of 15 torr, or a temperate increase of 3° C.

Figure 7:
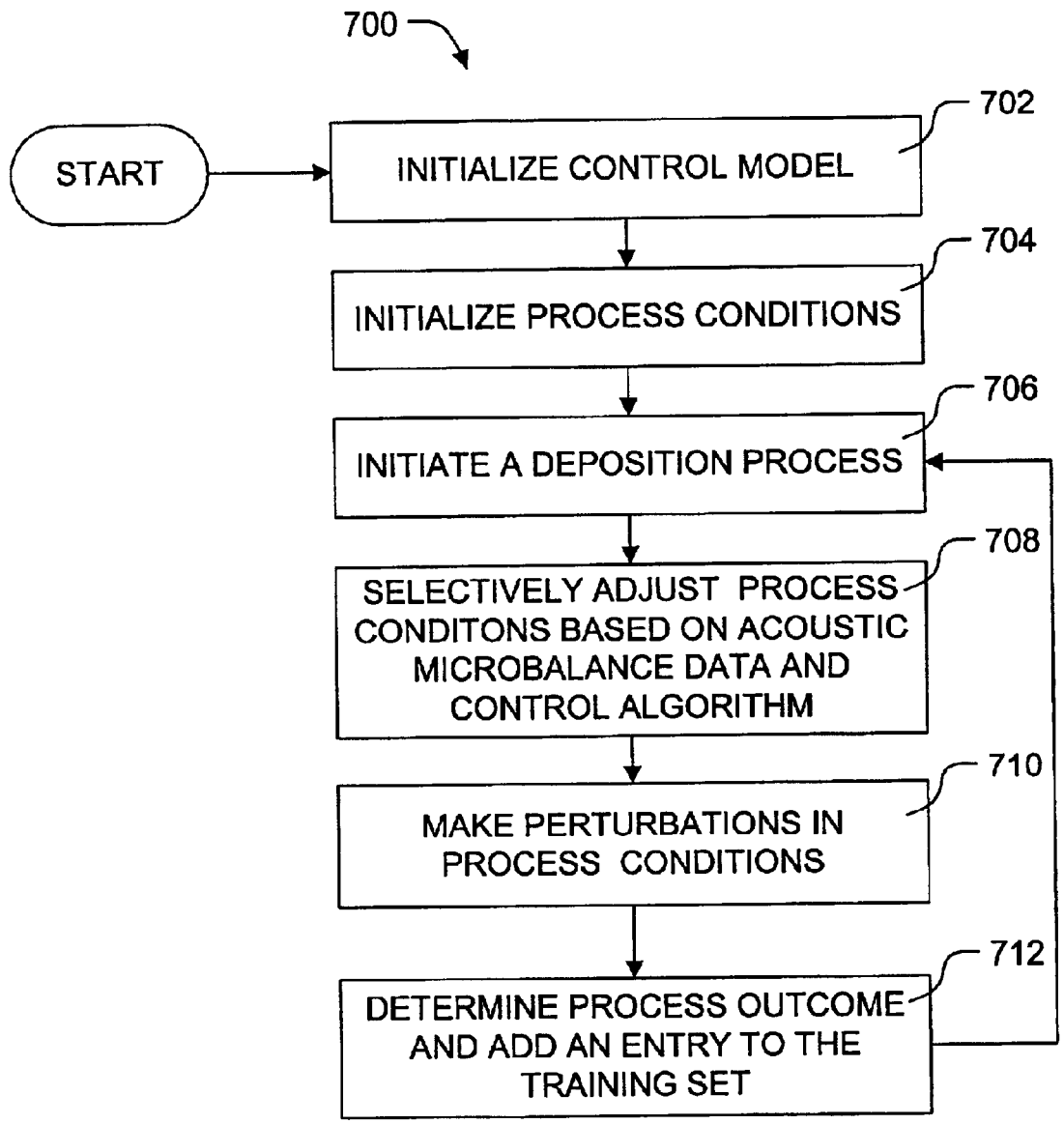
FIG. 7 is a flow diagram for process control with a probabilistic dependancy model wherein perturbations are

FIG. 7 illustrates a process 700 according to a still further aspect of the invention. In process 700, deposition is controlled with a probabilistic dependancy model that learns over time. The model is initialized in act 702, with or without training data. Where no training data is available, the control algorithm does not make any changes in the process conditions until sufficient data is gathered to warrant such changes. At act 704, process conditions are initialized for a current run. The initial process conditions generally do not change from run to run, although the model can take such changes into account. Act 706 comprises initiating the deposition process.

The process 700 continues at act 708 which is carried out some time into the deposition process, generally at one or more fixed times. For example, act 708 can be carried out at a time when the deposition process is approximately half way complete. Act 708 involves taking evidence regarding the state of the deposition process together with prospective changes to process conditions and applying them to a probabilistic dependancy model to predict process outcomes as a function of prospective changes to process conditions. All combinations of prospective changes that correspond to available data are tried. From among the combinations of prospective changes for which the model can predict the process outcome with an acceptable degree of confidence, such as 90%, the combination of prospective changes producing the best outcome is selected. If the model cannot predict the effects of any changes with confidence, no changes are made in Act 708.

At act 710 random and/or arbitrary changes to process conditions are introduced in order to produce training data. For example, the pressure, or the flow rate of a gas, can be increased or decreased by a fixed amount. The perturbations are large enough to produce detectable changes in the process outcome, but are small enough that the changes in process outcome are within acceptable limits. If a particular change results in a consistent improvement for a particular process state, the changes will subsequently be implemented in act 708 whenever that process state is detected. Subsequent perturbations will be about the adjusted values.

As an example of how the process 700 works, a system that controls the pressure based on evidence including a resonance frequency change and a temperature will be considered. Initially, the pressure is set to $P_0$. During the first 40 process runs, for example, the pressure is perturbed by $\pm \Delta P$. After the first 40 runs, the model predicts with 90% confidence that the process outcome improves if the pressure is increased by $\Delta P$ whenever the frequency change is below $\Delta f_1$ and the temperature is above $T_1$. During subsequent runs, the pressure is increased by $\Delta P$ in Act 708 whenever those conditions are met Random perturbations are then made with respect to the new pressure, and thus the system begins to accumulate data regarding the process outcome when, for example, the pressure is $P_0 + 2\Delta P$, the frequency change is below $\Delta f_1$, and the temperature is above $T_1$.

The process 700 concludes at act 720 wherein the process outcome is determined and combined with the evidence observed during deposition to create a new training example. The new training example is added to the previously obtained training examples, whereby the training set increases steadily. The probabilistic dependancy model can be updated to reflect the new training data each time a new data point is added, or just periodically, once a day for example.

Although the invention has been shown and described with respect to certain embodiments, alterations and modifications providing equivalent structures and acts are likely to occur to those of ordinary skill in the art upon the reading and understanding this specification and the associated drawings. Such alterations and modifications are intended to fall within the scope of the present invention, unless expressly stated to the contrary. Components described in functional terms have structure and involve acts, unless otherwise indicated, corresponding to any of the devices and methods known to those of ordinary skill in the art to perform those functions, even though not equivalent to any of the structure and acts that perform those function in the exemplary embodiments of the invention. In addition, while a particular feature of the invention may have been disclosed with respect to only one of several embodiments, such feature may be combined with one or more other features of the other embodiments as may be desired or advantageous for a given or particular application.

What is claimed is:

1. A system for depositing films on semiconductor wafers comprising:

a deposition chamber;

an acoustic microbalance configured for mounting within the deposition chamber, and a controller;

wherein the controller is configured to provide feedback control based on data provided at least in part by the acoustic microbalance.

2. The system of claim 1, wherein the system is configured for sequential batch operation and the controller controls one or more process conditions for a batch based, at least in part, on data obtained from a preceding batch.

3. The system of claim 2, wherein the controller detects a deposition process endpoint based, at least in part, on data provided by the acoustic microbalance.

4. The system of claim 1, wherein the feedback control is over an active deposition process, whereby one or more process conditions in the active process are selectively modified.

5. The system of claim 4, wherein the controller comprises a computer system component that encodes a probabilistic dependancy model relating a set of input variables that includes at least a measurement from the acoustic microbalance to one or more outputs that relate to an effect of modifying one or more process conditions.

6. The system of claim 1, wherein the acoustic microbalance is mounted on one of the semiconductor wafers.

7. The system of claim 1, wherein the acoustic microbalance is mounted on a control wafer.

8. The system of claim 1, wherein the acoustic microbalance is a surface acoustic wave device.

9. The system of claim 1, wherein the acoustic microbalance comprises a quartz crystal.

10. A system for depositing films on semiconductor wafers comprising:

a deposition chamber;

an acoustic microbalance having a cantilever and configured for mounting within the deposition chamber; and a controller;

wherein the controller is configured to detect the endpoint of a deposition process based on data provided at least in part by the acoustic microbalance; and the controller comprises a computer system component that encodes a model or database that accounts for a difference between an extent of deposition on the cantilever and an extent of deposition on the semiconductor wafers.

11. The system of claim 10, wherein the computer system component encodes a probabilistic dependancy model that the computer system employs in accounting for the difference between the extent of deposition on the cantilever and the extent of deposition on the semiconductor wafers.

12. The system of claim 10, wherein the controller is configured to provide feedback control based on data provided at least in part by the acoustic microbalance.

13. The system of claim 10, wherein the system is configured for sequential batch operation and the controller controls one or more process conditions for a batch based, at least in part, on data obtained from a preceding batch.

14. The system of claim 10, wherein the controller is configured to exercise feedback control over one or more process conditions.

15. The system of claim 14, wherein the controller comprises a computer system component that encodes a probabilistic dependancy model relating a set of input variables that includes at least a measurement from the acoustic microbalance to one or more outputs that relate to the effect modifying one or more process conditions.

16. The system of claim 10, wherein the acoustic microbalance is mounted on one of the semiconductor wafers.

17. The system of claim 10, wherein the acoustic microbalance is mounted on a control wafer.

18. The system of claim 10, wherein the acoustic microbalance is a surface acoustic wave device.

19. The system of claim 10, wherein the acoustic microbalance comprises a quartz crystal.

* * * * *